US009941452B2

(12) United States Patent
Mao et al.

(10) Patent No.: US 9,941,452 B2
(45) Date of Patent: Apr. 10, 2018

(54) DISPLAY DEVICE

(71) Applicant: Innolux Corporation, Miao-Li County (TW)

(72) Inventors: Li-Wei Mao, Miao-Li County (TW); Tung-Kai Liu, Miao-Li County (TW); Bo-Feng Chen, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/431,831

(22) Filed: Feb. 14, 2017

(65) Prior Publication Data
US 2017/0263828 A1   Sep. 14, 2017

(30) Foreign Application Priority Data

Mar. 14, 2016 (TW) .............................. 105107796 A

(51) Int. Cl.
| H01L 27/00 | (2006.01) |
| H01L 33/58 | (2010.01) |
| H01L 25/075 | (2006.01) |
| H01L 25/16 | (2006.01) |
| H01L 33/62 | (2010.01) |
| H01L 33/06 | (2010.01) |
| H01L 33/32 | (2010.01) |
| H01L 33/30 | (2010.01) |
| H01L 33/14 | (2010.01) |

(Continued)

(52) U.S. Cl.
CPC .......... H01L 33/58 (2013.01); H01L 25/0753 (2013.01); H01L 25/167 (2013.01); H01L 27/326 (2013.01); H01L 27/3248 (2013.01); H01L 27/3272 (2013.01); H01L 33/06 (2013.01); H01L 33/14 (2013.01); H01L 33/22 (2013.01); H01L 33/30 (2013.01); H01L 33/32 (2013.01); H01L 33/502 (2013.01); H01L 33/56 (2013.01); H01L 33/62 (2013.01); G02B 5/003 (2013.01); H01L 2924/12041 (2013.01); H01L 2933/0083 (2013.01); H01L 2933/0091 (2013.01)

(58) Field of Classification Search
CPC ....... H01L 2924/12041; H01L 27/3272; H01L 27/326; H01L 27/3248
See application file for complete search history.

(56) References Cited

U.S. PATENT DOCUMENTS 7,791,093 B2   9/2010  Basin et al.
7,893,448 B2   2/2011  Kim
(Continued)

FOREIGN PATENT DOCUMENTS

TW    201546529 A    12/2015

OTHER PUBLICATIONS

Taiwanese Office Action dated Aug. 22, 2016.

Primary Examiner — Ngan Ngo
(74) Attorney, Agent, or Firm — Rabin & Berdo, P.C.

(57) ABSTRACT

A display device is provided. The display device includes a first substrate, a display unit, a second substrate, and a light shielding structure. The display unit is disposed on the first substrate and includes at least one light emitting diode chip. The light shielding structure surrounds the light emitting diode chip of the display units and is located between the first substrate and the second substrate.

17 Claims, 13 Drawing Sheets

(51) Int. Cl.
    *H01L 33/56*     (2010.01)
    *H01L 33/50*     (2010.01)
    *H01L 33/22*     (2010.01)
    *H01L 27/32*     (2006.01)
    *G02B 5/00*     (2006.01)

(56) References Cited

U.S. PATENT DOCUMENTS

| | | |
|---|---|---|
| 8,415,692 B2 | 4/2013 | Le Toquin |
| 2008/0101086 A1 | 5/2008 | Lee |
| 2010/0200884 A1 | 8/2010 | Lee et al. |
| 2011/0305024 A1 | 12/2011 | Chang |
| 2014/0286009 A1* | 9/2014 | Hamilton ................ F21V 23/00 |
| | | 362/249.02 |
| 2014/0339495 A1 | 11/2014 | Bibl et al. |
| 2017/0104137 A1* | 4/2017 | Kobayakawa ...... H01L 33/0095 |

* cited by examiner

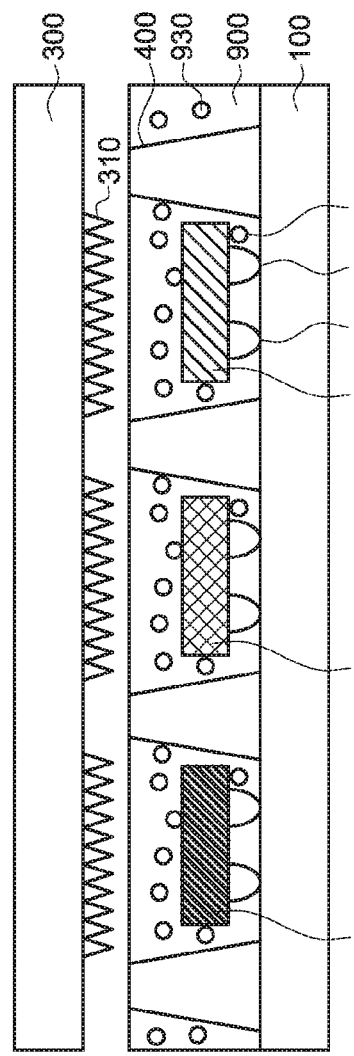
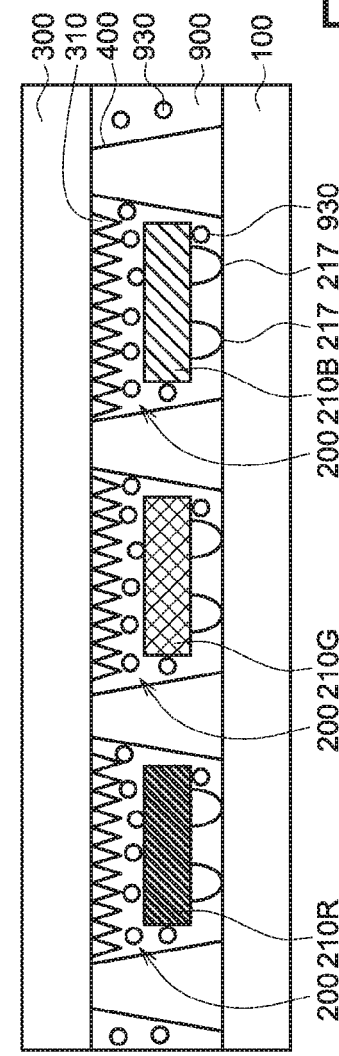

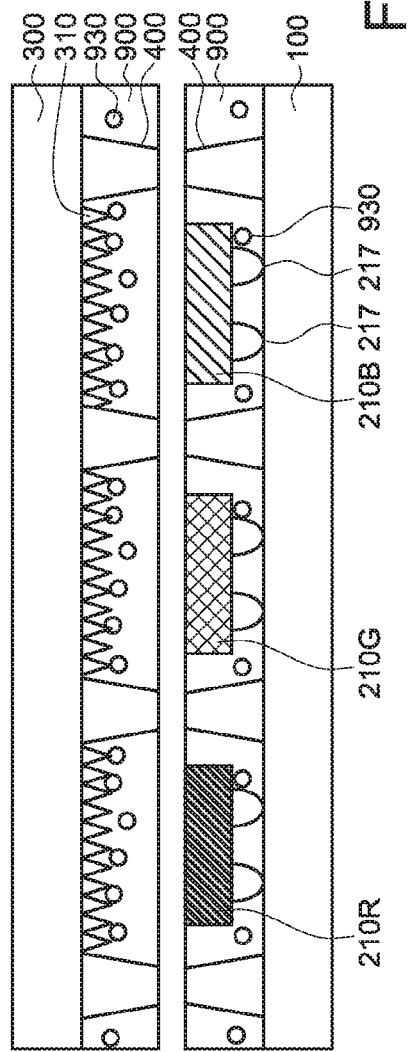
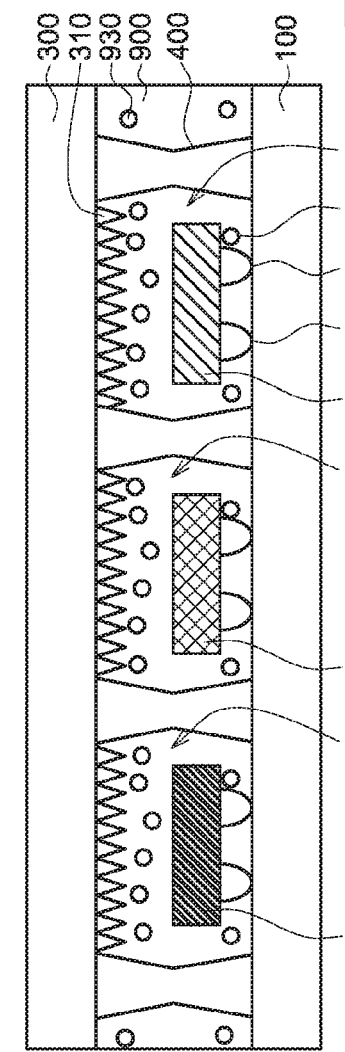

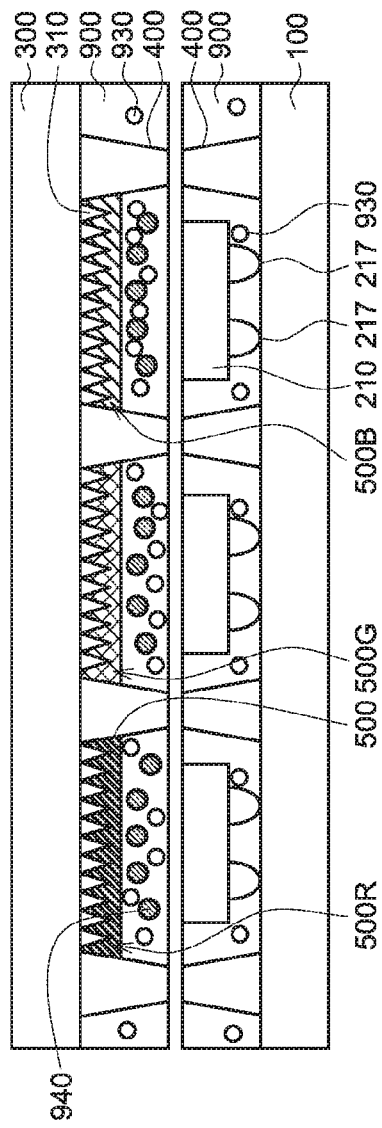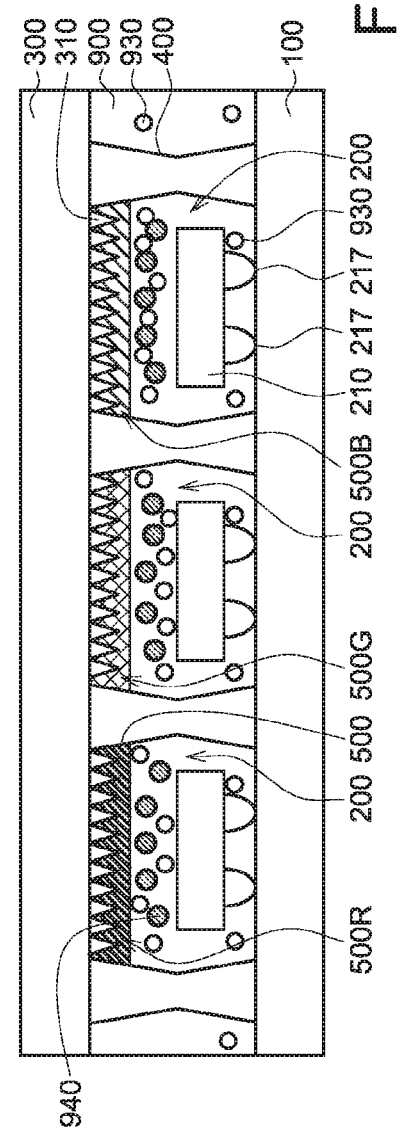

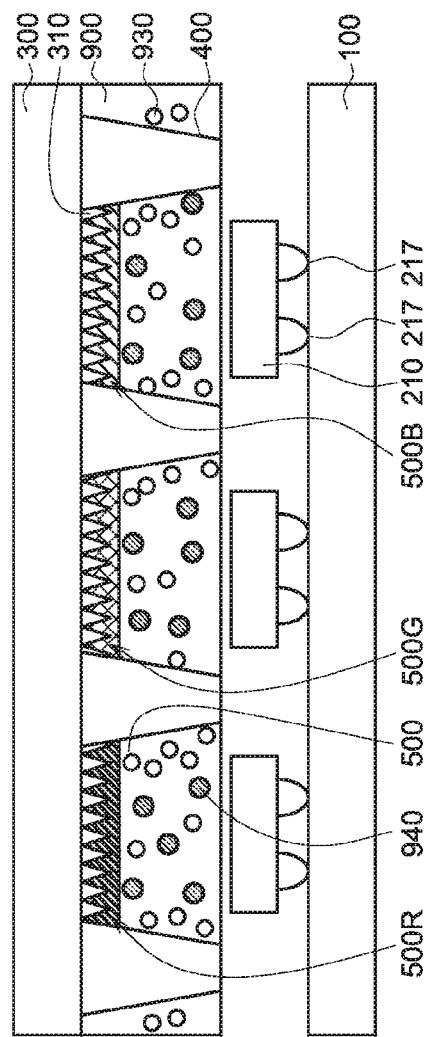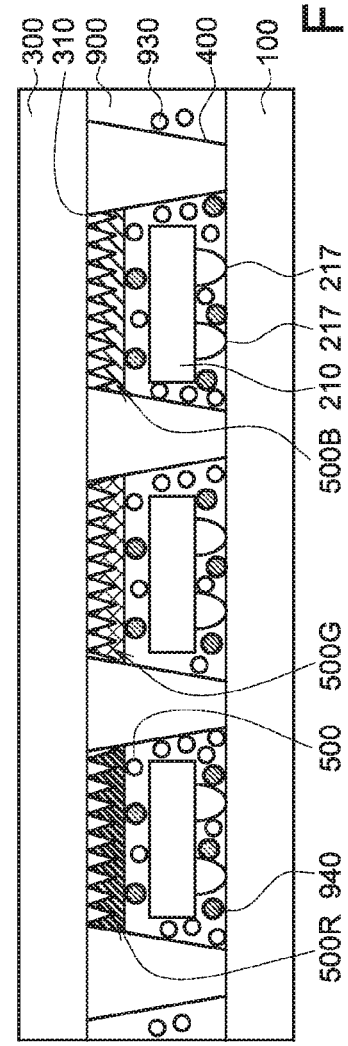

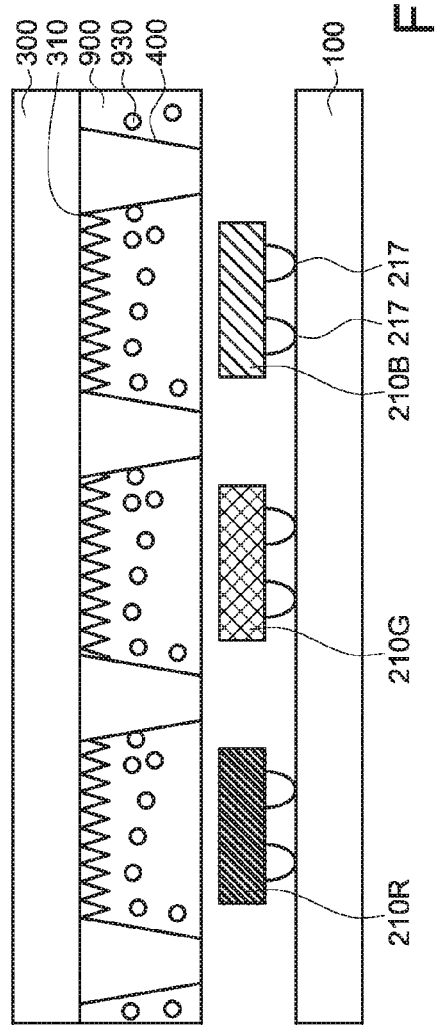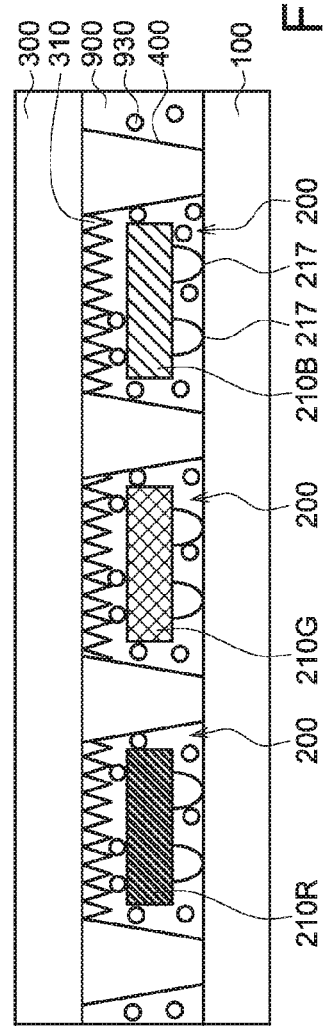

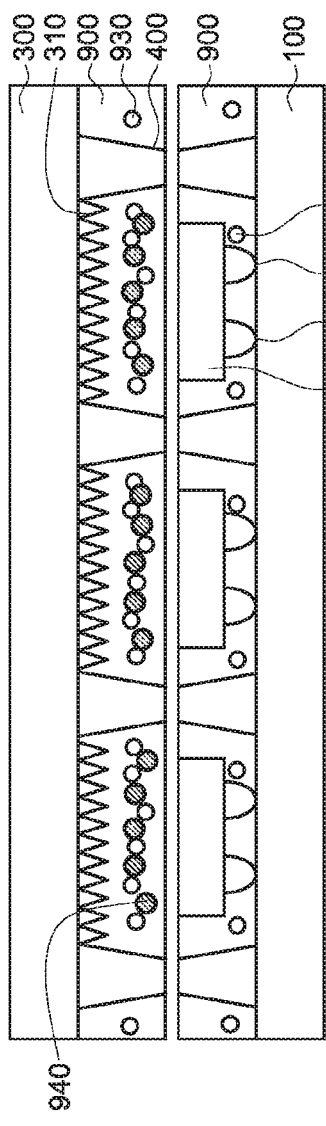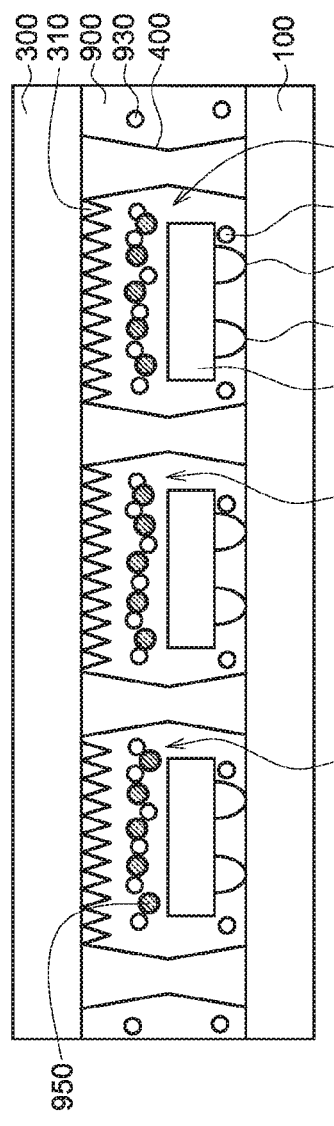

DISPLAY DEVICE

This application claims the benefit of Taiwan application Serial No. 105107796, filed Mar. 14, 2016, the subject matter of which is incorporated herein by reference.

BACKGROUND

Field of the Invention

The disclosure is related in general to a display device, and particularly to a display device having a display unit with light emitting diode(s).

Description of the Related Art

People's pursuit to high brightness and high color saturation of images visible to human eyes has led the developments and applications of display technology. In daily life, applications of displays are everywhere, such as banners, televisions, vehicle navigations, and etc. However, developments of various types of display panels, starting from earlier CRT displays, plasma displays, liquid crystal displays to organic light emitting displays (OLED), have met similar issues.

For example, consumption of electrical powder usually rises rapidly along with the increases of resolution of display monitors, and the increases of resolution are usually accompanied by the occurrence of color-mixing. The manufacture and mass production of flexible substrates, of which the applications in display monitors are still restricted by the manufacturing limits, are still facing difficulties. Therefore, how to provide a display panel with excellent display quality and manufacturing competitiveness is still one of the research topics in industry.

SUMMARY OF THE INVENTION

The disclosure is directed to a display device. In the display device of the embodiments, the light shielding structure surrounds the display unit, such that the light emitted from the light emitting diode chip in one display unit can be limited within the range surrounded by the light shielding structure, and thus the mixing of lights from adjacent display units can be reduced. The following description of the embodiments of the present disclosure is made with reference to the accompanying drawings.

According to an embodiment of the present disclosure, a display device is provided. The display device includes a first substrate, a display unit, a second substrate, and a light shielding structure. The display unit is disposed on the first substrate, and the display unit includes at least one light emitting diode chip. The light shielding structure surrounds the at least one light emitting diode chip of the display unit, and the light shielding structure is located between the first substrate and the second substrate.

The above and other aspects of the disclosure will become better understood with regard to the following detailed description of the preferred but non-limiting embodiment(s). The following description is made with reference to the accompanying drawings.

BRIEF DESCRIPTION OF THE DRAWINGS

FIGS. 10A-10B, FIGS. 11A-11B, FIGS. 12A-12B, FIGS. 13A-13B, FIGS. 14A-14B and FIGS. 15A-15B show schematic drawings of display devices and the assemblies thereof according to some embodiments of the present disclosure.

DETAILED DESCRIPTION OF THE INVENTION

Figure 1A:
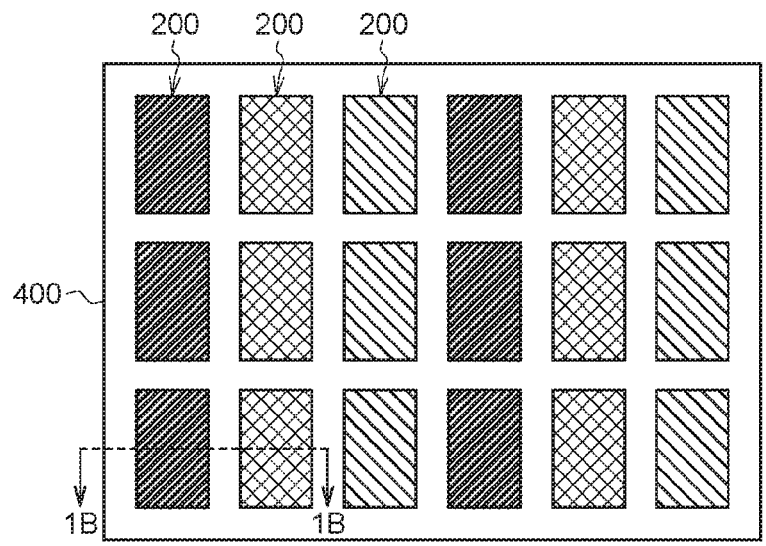
FIG. 1A shows a top view of a display device according to an embodiment of the present disclosure.

According to the embodiments of the disclosure, in the display device, the light shielding structure surrounds the display unit, such that the light emitted from the light emitting diode chip in one display unit can be limited within the range surrounded by the light shielding structure, and thus the mixing of lights from adjacent display units can be reduced. The embodiments are described in details with reference to the accompanying drawings. The elements sharing similar or the same labels are similar or the same elements in the drawings. It is to be noted that some of the secondary elements are omitted in the drawings accompanying the following embodiments to highlight the technical features of the disclosure. The embodiments are for exemplification only, not for limiting the scope of protection of the disclosure. One of ordinary skills in the art may modify or change the structures according to actual needs.

Figure 1B:
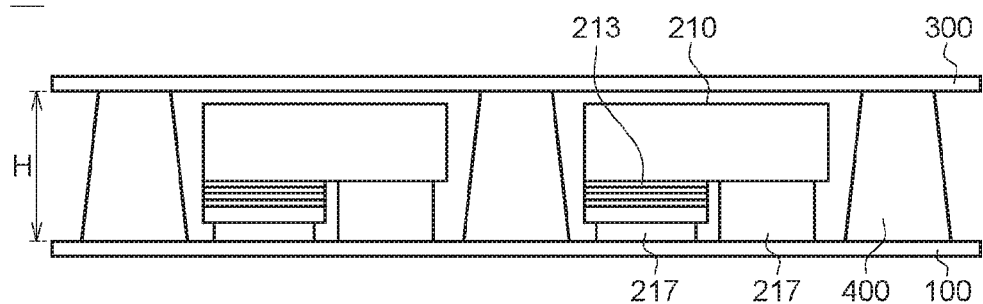
FIG. 1B shows a cross-sectional view along the cross-section line 1B-1B' in FIG. 1A.

FIG. 1A shows a top view of a display device according to an embodiment of the disclosure, and FIG. 1B shows a cross-sectional view along the cross-section line 1B-1B' in FIG. 1A. As shown in FIGS. 1A-1B, the display device 10 includes a first substrate 100, a plurality of display units 200, a second substrate 300, and a light shielding structure 400. The display units 200 are disposed on the first substrate 100, and each of the display units 200 includes at least one light emitting diode chip 210. The light shielding structure 400 surrounds the display units 200. The light shielding structure 400 is located between the first substrate 100 and the second substrate 300, and the light shielding structure 400 contacts the first substrate 100 and the second substrate 300.

In the embodiments, the light shielding structure 400 is made by such as a light absorbing material of a light reflecting material; as such, it is difficult for lights to pass through the light shielding structure 400. In the embodiment, the light shielding structure 400 surrounds the display unit 200 and contacts the first substrate 100 and the second substrate 300, such that the light emitted from the light emitting diode chip 210 in one display unit 200 can be limited within the range surrounded by the light shielding structure 400, and thus the mixing of lights from adjacent display units 200 can be reduced. The height H of the light shielding structure 400 could be ranged from 3 µm to 30 µm, and preferably ranged from 5 µm to 25 µm. A top portion of the light shielding structure 400 is at least higher than a top portion of the light emitting diode chip 210; in other words, the top portion of the light emitting diode chip 210 does not contact the second substrate 300, and the top portion of the light emitting diode chip 210 and the second substrate 300 are separated by a gap. The light shielding structure 400 may be a net-like structure constructed by staggeredly crossing a wall structure extending along a first direction and another wall structure extending along a second direction, forming a mesh with a plurality of openings, and the first direction and the second direction may be respectively X axis and Y axis. The light shielding structure 400 has a bottom surface width (area) adjacent to the first substrate 100 and a top surface width (area) adjacent to the second substrate 300, and the bottom surface width (area) is preferably greater than the top surface width (area), but the disclosure is not limited thereto. Alternatively, the bottom surface width (area) may be less than the top surface width (area). The side surface of the light shielding structure 400 may be planar or curved.

As shown in FIG. 1B, in the embodiment, one display unit 200 includes one light emitting diode chip 210. As shown in FIGS. 1A-1B, the light shielding structure 400 surrounds the light emitting diode chip 210. And along a viewing direction perpendicular to the first substrate 100 or the second substrate 300, the area enclosed by the light shielding structure 400 is larger than the area occupied by the light emitting diode chip 210, and the light emitting diode chip 210 is located in a single opening of the mesh of the light shielding structure 400. In other embodiments, one display unit 200 may include a plurality of light emitting diode chips 210, and the light emitting diode chips 210 may provide lights with the same color or different colors. For example, the light emitting diode chips 210 may be all white light emitting diode chips, or the light emitting diode chips 210 may be a combination of a red light emitting diode chip, a blue light emitting diode chip and a green light emitting diode chip; in addition, along a viewing direction perpendicular to the first substrate 100 or the second substrate 300, the area enclosed by the light shielding structure 400 is greater than the total area occupied by the light emitting diode chips 210, and the light emitting diode chips 210 are located in a single opening of the mesh of the light shielding structure 400.

In the embodiment, as shown in FIG. 1B, specifically speaking, the light emitting diode chip 210 includes a light emitting layer 213, and the light shielding structure 400 surrounds the light emitting layer 213. In other embodiments, the light emitting diode chip 210 may include a composite structure including a plurality of light emitting layers 213.

In the embodiment, the light shielding structure 400 contacts the second substrate 300, which faces the light emitting surface, and surrounds the display unit 200, such that the light emitted from one display unit 200 can be limited within the range surrounded by the light shielding structure 400, the light can be emitted from the top portion of the display unit 200 (the second substrate 300), and thus the mixing of lights from adjacent display units 300 can be reduced. For example, one display unit 200 can include one light emitting diode chip 210, this display unit 200 is such as a sub-pixel, and the light shielding structure 400 can prevent the interference of lights from adjacent sub-pixels.

In the embodiment, as shown in FIG. 1B, the first substrate 100 supporting the display unit 200 and located on the back side of the display unit 200 may include a material of such as light-transmitting glass, sapphire, plastic, or other suitable light-transmitting material, or the material may as well be non-transparent glass fiber or non-light transmitting metal foil and silicon and etc. The second substrate 300 is located on the light emitting side of the display unit 200, therefore the material of the second substrate 300 requires to be a light-transmitting material, such as glass, sapphire, plastic, or other suitable light-transmitting material. The light shielding structure 400, for example, may have a height H, the height H is ranged from 3 µm to 30 µm, or even ranged from 5 µm to 25 µm with a wall shape. The material of the light shielding structure 400 may be an organic material or an inorganic material added with a black material, e.g. carbon. The material of the light shielding structure 400 may as well an organic material block body or an inorganic material block body with reflective metal coated on the surface thereof, and the bottom width may be greater than, less than, or equal to the top width. In the embodiment, the feature size (or the maximum of a length, a diameter or a width) of a light emitting diode chip 210 is ranged from 0.1 µm to 100 µm, preferably ranged from 0.1 µm to 10 µm. In other words, in the embodiments of the disclosure, the display unit 200 adopts a micro light emitting diode chip (µLED).

In the embodiment, as shown in FIG. 1B, the display unit 200 may further include a plurality of contact pads 217 (the two contact pads 217 as shown in FIG. 1B are such as a first contact pad and a second contact pad), the first substrate 100 may include a thin film transistor (not shown in FIGS. 1A-1B) and a signal electrode (such as a common electrode), and the anode and the cathode of the as-formed light emitting diode chip 210 may be electrically connected to the thin film transistor and the signal electrode (such as a common electrode) respectively via the contact pads 217. The light emitting layer is disposed between the anode and the cathode. For example, the light emitting diode chip 210 may be electrically connected to the thin film transistor via the first contact pad and electrically connected to the signal electrode via the second contact pad.

In the embodiment, the first substrate 100 is such as a thin film transistor substrate, the second substrate 300 is such as a cover glass, and both may be additionally provided with touch sensing structures and circuit layouts.

According to the embodiments of the disclosure, the light emitting diode chip 210 can be actively driven by the corresponding thin film transistor for independently adjust the brightness, and the light emitting diode chip 210 is used as a light emitting pixel/sub-pixel unit, thereby an active color display can be formed. Moreover, micro light emitting diode chips 210 made of inorganic materials can have advantages of operations for long time and under low currents, such that the colorfulness and resolution of the display device can be increased without increasing the power consumption of the display device, and occurrences of light-mixing can be as well reduced. In addition, due to the extremely small size of the micro light emitting diode chips 210, the chips can be directly bonded to a solid substrate or a flexible substrate, providing more applications.

Figure 2A:
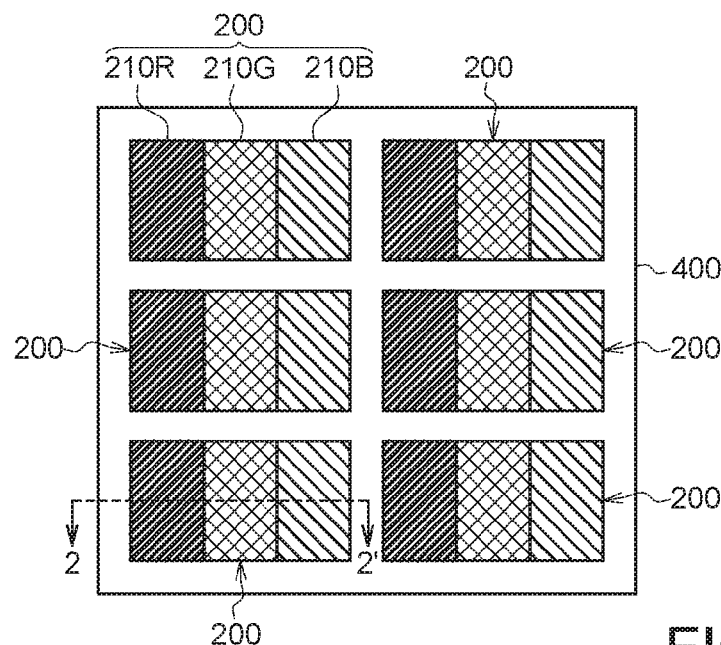
FIG. 2A shows a top view of a display device according to another embodiment of the present disclosure.
Figure 2B:
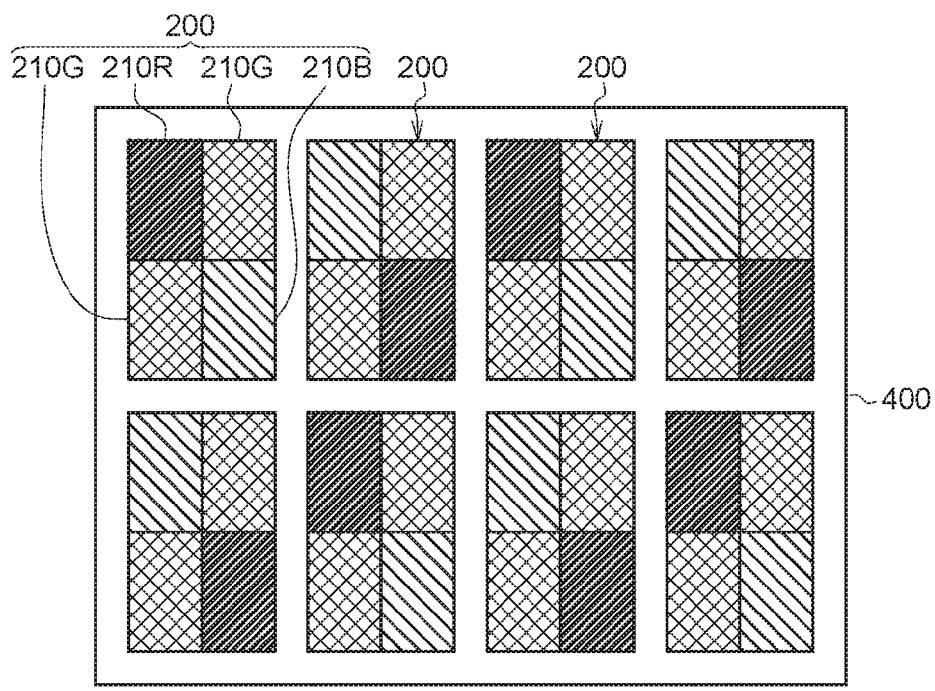
FIG. 2B shows a top view of a display device according to a further embodiment of the present disclosure.

FIG. 2A shows a top view of a display device according to another embodiment of the disclosure, and FIG. 2B shows a top view of a display device according to a further embodiment of the disclosure. The elements in the embodiment sharing similar or the same labels with those in the previous embodiment are similar or the same elements, and the description of which is omitted.

As shown in FIGS. 2A-2B, the display unit 200 may include a plurality of light emitting diode chips, and the light shielding structure 400 surrounds the light emitting diode chips. In the embodiments, in the display device 20 as shown in FIG. 2A, one display unit 200 may include three light emitting diode chips 210, and in the display device 30 as shown in FIG. 2B, one display unit 200 may include four light emitting diode chips 210. For example, one display unit 200 of the display device 20 may include one red light emitting diode chip 210R, one green light emitting diode chip 210G and one blue light emitting diode chip 210B, the light shielding structure 400 surrounds the red light emitting diode chip 210R, the green light emitting diode chip 210G and the blue light emitting diode chip 210B, and the red light emitting diode chip 210R, the green light emitting diode chip 210G and the blue light emitting diode chip 210B are located in the same one opening of the mesh of the light shielding structure 300. One display unit 200 of the display device 30 may include one red light emitting diode chip 210R, two green light emitting diode chips 210G and one blue light emitting diode chip 210B, the light shielding structure 400 surrounds the red light emitting diode chip 210R, the two green light emitting diode chips 210G and the blue light emitting diode chip 210B, and the red light emitting diode chip 210R, the two green light emitting diode chips 210G and the blue light emitting diode chip 210B are located in the same one opening of the mesh of the light shielding structure 300. As such, one display unit 200 of the display device 20 and 30 may be such as a pixel presenting different grey levels and colors, and the light shielding structure 400 prevent the interference of lights from different pixels.

Figure 3A:
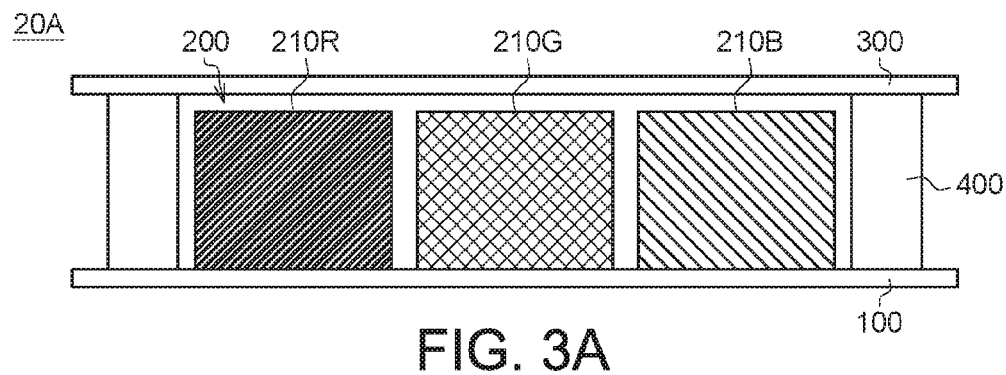
FIGS. 3A-3C show cross-sectional views along the cross-section line 2-2' in FIG. 2A according to some embodiments of the present disclosure.
Figure 3B:
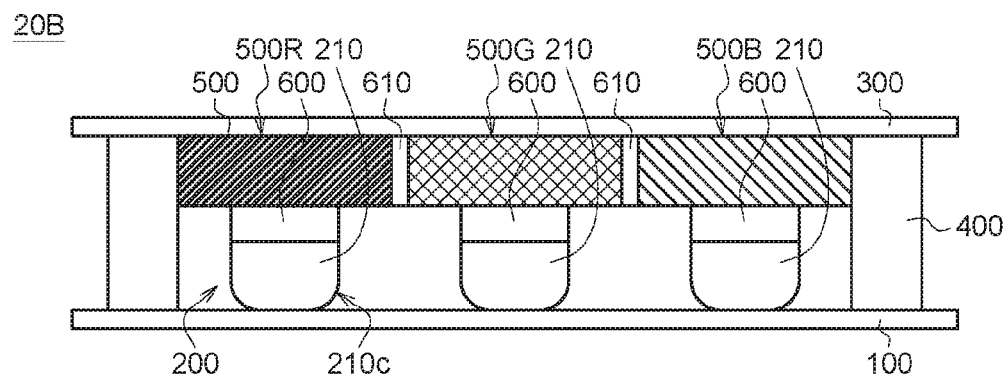
Figure 3C:
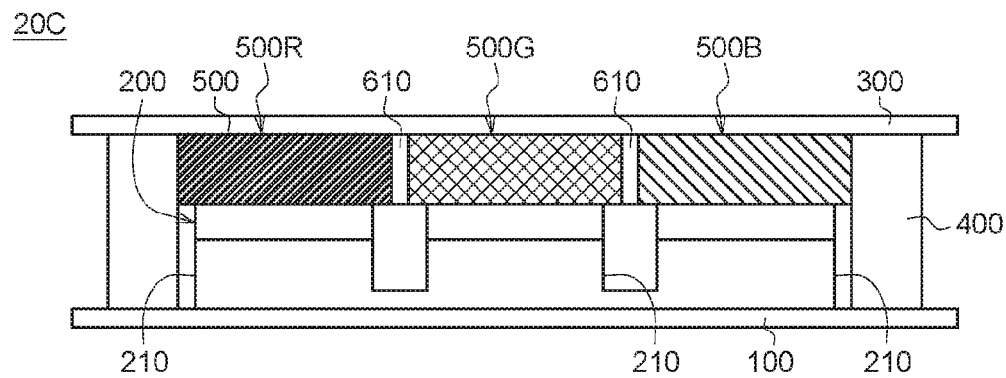

FIGS. 3A-3C show cross-sectional views along the cross-section line 2-2' in FIG. 2A according to some embodiments of the disclosure. The elements in the embodiment sharing similar or the same labels with those in the previous embodiment are similar or the same elements, and the description of which is omitted. It is to be noted that the anodes and the cathodes of the light emitting diode chips as shown in FIGS. 3A-3C are all electrically connected to the thin film transistors of the first substrates 100 via contact pads (not shown in FIGS. 3A-3C).

As shown in FIG. 3A, in the display device 20A, one display unit 200 includes three light emitting diode chips 210R, 210G and 210B surrounded by the light shielding structure 400, and the three light emitting diode chips 210R, 210G and 210B are located in one opening of the mesh of the light shielding structure 400. Each of the light emitting diode chips 210R, 210G and 210B independently controls its luminous color, and thus the luminous color of a light emitting diode chip 210R, 210G or 210B is not changed even if the emitted light passes though adjacent light emitting diode chip(s); therefore, light leakage between adjacent display units 200, which would cause issues of reduction of sharpness and contrast or color shifts, can be prevented.

As shown in FIG. 3B, in the display device 20B, one display unit 200 includes three light emitting diode chips 210, and these chips 210 are electrically connected to the first substrate 100 and are surrounded by the light shielding structure 400. The display unit 200 may further include a color filter layer 500 and a plurality of phosphor layers 600. The color filter layer 500 is disposed on the second substrate 300. The color filter layer 500 has a plurality of color regions 500R, 500G and 500B, and the color regions are respectively disposed on each of the corresponding light emitting diode chips. The phosphor layers 600 are separated from each other. Each of the phosphor layers 600 is respectively disposed between each of the corresponding light emitting diode chips 210 and the color regions 500R, 500G and 500B.

As shown in FIG. 3B, the light emitting diode chips 210 are such as blue light emitting diode chips, and the phosphor layers 600 are such as yellow phosphor layers. The blue lights emitted from the light emitting diode chips 210 pass through the phosphor layers 600 are converted into white lights, and then the converted lights respectively pass through the color regions 500R, 500G and 500B respectively corresponding to red, green and blue colors to emit red light, green light and blue light. In addition, the area of a color region is larger than the area of the corresponding phosphor layer 600, such that the occurrence of the light-mixing issue can be further reduced.

In some embodiments, as show in FIG. 3B, the phosphor layers 600 may contact the color regions 500R, 500G and 500B. In some other embodiments, the phosphor layers 600 may be separated from the color regions 500R, 500G and 500B by a distance (not shown in drawings).

As shown in FIG. 3B, the display device 20B may further include a plurality of light shielding layers 610 separating the color regions 500R, 500G and 500B from one another, which makes it difficult for a white light entering a color region to pass through another color region, reducing the mixing of lights; moreover, issues of reduction of sharpness and contrast or color shifts caused by light leakage can be further prevented.

As shown in FIG. 3B, the light emitting diode chip 210 may have an arc-shaped bottom 210c, of which the cross-section may be represented as a parabolic curve or other types of curves. The design of the arc-shaped bottom 210c can increase the effects of convergence and concentration of lights of the light emitting diode chip 210.

As shown in FIG. 3C, in the display device 20C, three light emitting diode chips 210 are connected with a portion of the layers at bottom, such as with the N type layers or the substrates. As such, in the manufacturing process of the display device 20C, when the light emitting diode chips and the first substrate 100 are assemble for electrical connection, three light emitting diode chips can be assembled in one step, and thus the manufacturing time can be reduced.

Figure 4A:
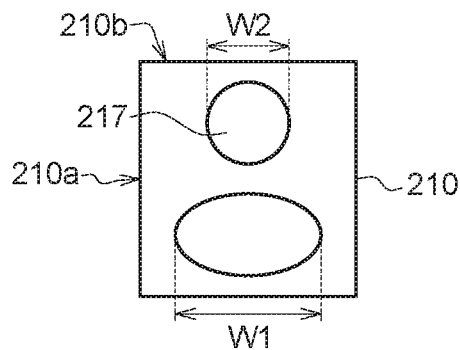
FIGS. 4A-4B show top views of contact pads according to some embodiments of the present disclosure.
Figure 4B:
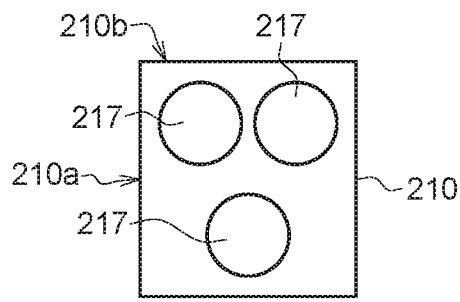

FIGS. 4A-4B show top views of contact pads according to some embodiments of the disclosure. The elements in the embodiment sharing similar or the same labels with those in the previous embodiment are similar or the same elements, and the description of which is omitted.

In the embodiment as shown in FIG. 4A, the anode and the cathode of one light emitting diode chip 210 are respectively electrically connected to two contact pads 217, and the two contact pads 217 are disposed along the long side 210a of the light emitting diode chip 210. The two contact pads 217 respectively have width W1 and width W2 along the short side 210b of the light emitting diode chip 210, and the width W1 and the width W2 of the two contact pads 217 are different. In the embodiment, the two contact pads 217 are respectively electrically connected to a P type layer and an N type layer (not shown in drawings) of the light emitting diode chip 210, and an intervening layer between the P type layer and the N type layer is the light emitting layer.

In the embodiment as shown in FIG. 4B, one light emitting diode chip 210 can be electrically connected to three contact pads 217, and the three contact pads 217 are arranged to form a triangle pattern. In the embodiment, the three contact pads 217 may include such as a first contact pad, a second contact pad and a third contact pad, the light emitting diode chip 210 is electrically connected to the thin film transistor via the first contact pad, the light emitting diode chip 210 is electrically connected to the signal electrode via the second contact pad, and the light emitting diode chip 210 can be electrically connected to the thin film transistor or the signal electrode via the third contact pad.

According to the embodiments of the disclosure, the contact pads 217 are arranged in the fashions as shown in FIGS. 4A-4B, the light emitting diode chip 210 can be prevented from tilting towards the two long side 210a directions, such that the light emitting diode chip 210 can be disposed more stably, and the undesired influences of tilted chip to the light pattern, brightness and color can be further prevented.

Figure 5:
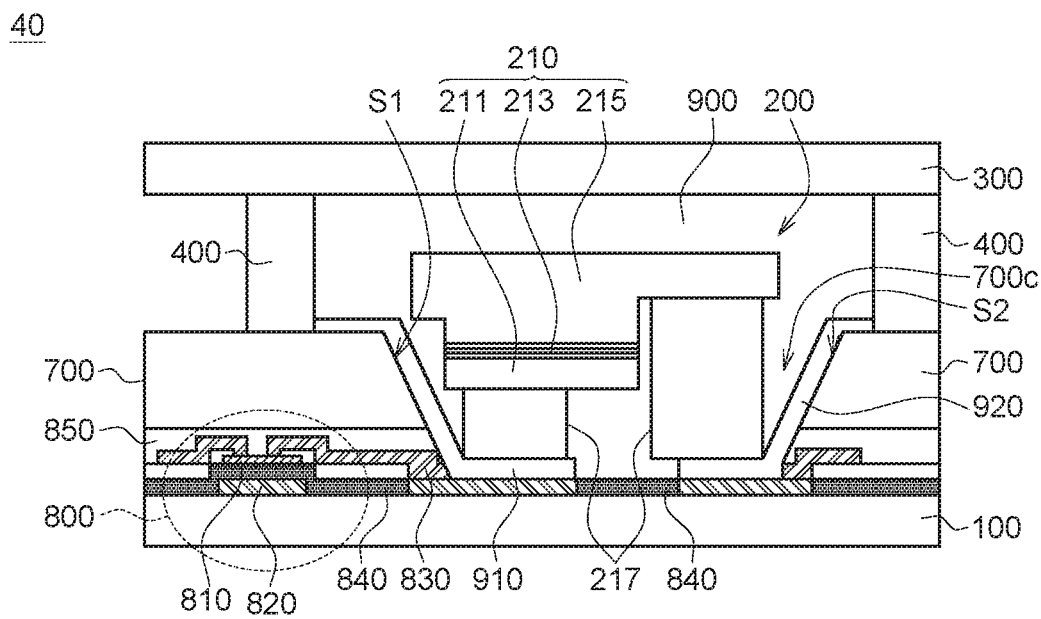
FIG. 5 shows a cross-sectional view of a display device according to another embodiment of the present disclosure.

FIG. 5 shows a cross-sectional view of a display device according to another embodiment of the disclosure. The elements in the embodiment sharing similar or the same labels with those in the previous embodiment are similar or the same elements, and the description of which is omitted.

As shown in FIG. 5, the display device 40 includes a first substrate 100, a display unit 200, a second substrate 300 and a light shielding structure 400. The display unit 200 includes a flip-chip type light emitting diode chip 210. The light emitting diode chip 210 includes a P type layer 211, a light emitting layer 213 and an N type layer 215. The P type layer 211 is disposed on the first substrate 100, the light emitting layer 213 is disposed on the P type layer 211, and the N type layer 215 is disposed on the light emitting layer 213. The P type layer 211, the light emitting layer 213 and the N type layer 215 are all made of semiconductor materials, such as GaN or GaAs. The P type layer 211 and the N type layer 215 can provide electrons and holes, the light emitting layer 213 acting as the active region has a multi-quantum well (MQW) structure, and the electrons and holes combine in the light emitting layer 213 to emit lights. The light emitting diode chip 210 may further include electrode layer(s), ohmic contact layer(s), electron/hole transport layer(s), or matching layer(s).

As shown in FIG. 5, the display device 40 may further include 1 patterned planarization layer 700. The patterned planarization layer 700 is disposed between the first substrate 100 and the light shielding structure 400, and the patterned planarization layer has a recess 700c. At least a portion of the light emitting diode chip of the display unit 200 is located in the recess 700c.

In the embodiment, as shown in FIG. 5, the patterned planarization layer 700 may be adjacent to or connected to the light shielding structure 400, and the patterned planarization layer 700 is preferably made of a light shielding material, yet the patterned planarization layer 700 may be made of a light-transmitting material as well. As such, the patterned planarization layer 700 and the light shielding structure 400 as a whole are provided with excellent light shielding effects and can effectively prevent the mixing of lights from different display units 200. In the embodiment, the patterned planarization layer 700 is such as an organic material layer added with a black material, the light shielding structure 400 is such as an organic material layer added with a black material, and the materials of the patterned planarization layer 700 and the light shielding structure 400 may be the same or different. In some other embodiments, the patterned planarization layer 700 may be such as a light-transmitting organic material layer.

As shown in FIG. 5, the first substrate 100 includes a thin film transistor 800, and the display device 40 may further include a first electrode layer 910 and a second electrode layer 920. The first electrode layer 910 is disposed on a first side surface S1 of the recess 700c, and the P type layer 211 of the light emitting diode chip 210 is disposed adjacent to the first substrate 100 and electrically connected to the first electrode layer 910 via a contact pad 217 (e.g. the first contact pad) and electrically connected to the thin film transistor 800 via the first electrode layer 910. The second electrode layer 920 is disposed on a second side surface S2 of the recess 700c, the second electrode layer 920 is electrically connected to the N type layer 215 of the light emitting diode chip 210 via another contact pad 217 (e.g. the second contact pad), the N type layer 215 is disposed adjacent to the second substrate 300, and the second electrode layer 920 may be connected to the signal electrode (e.g. common electrode). The light emitting layer 213 is disposed between the P type layer 211 and the N type layer 215. In some other embodiments, the P type layer 211 of the light emitting diode chip 210 may as well be connected to the first electrode layer 910 via a contact pad 217, the first electrode layer 910 is electrically connected to the signal electrode (e.g. common electrode), and the N type layer 215 of the light emitting diode chip 210 may as well be electrically connected to the second electrode 920, which is electrically connected to the thin film transistor 800. The cross-section of the recess 711c may have a profile of a parabolic curve, a straight line or other types of curves, and the cross-sections of the first side surface S1 and the second side surface S2 may as well have profiles of a parabolic curve, a straight line or other types of curves. In addition, the cross-section of the first electrode layer 910 disposed on the first side surface S1 and the cross-section of the second electrode layer 920 disposed on the second side surface S2 may also have profiles of a parabolic curve, a straight line or other types of curves.

In the embodiment, the first electrode layer 910 and the second electrode layer 920 may respectively be an anode and a cathode. The materials of the first electrode layer 910 and the second electrode layer 920 may include Cu, Ag, Au. Al, Sn, Ti, In, metal oxides, carbon, or suitable conductive materials, and the structures may be single-layered, alloyed, or multi-layered stacks. In the embodiment, the first electrode layer 910 and the second electrode layer 920 may have effects of reflective layers to reflect the lights emitted from the light emitting diode chip 210 towards the light emitting surface direction for effectively increasing the light extraction efficiency.

As shown in FIG. 5, the display device 40 may further include a gel layer 900. The gel layer 900 is disposed between the second substrate 300 and the light emitting diode chip 210, and the gel layer 900 has a third refractive index which is greater than or less than a second substrate refractive index of the second substrate 300. The difference in the refractive indexes generates refractions and reflections of lights at the interface between the inner side of the second substrate 300 and the gel layer 900.

In some embodiments, as shown in FIG. 5, the gel layer 900 may be filled in the spaces surrounded by the first substrate 100, the second substrate 300, the light shielding structure 400 and the patterned planarization layer 700, and the gel layer 900 may be filled in the recess 700c and contact the first electrode layer 910, the second electrode layer 920 and the contact pads 217.

In the embodiment, the first substrate 100 as shown in FIG. 5 may be a thin film transistor substrate having a semiconductor layer made of IGZO, LTPS, a-Si or other metal oxide semiconductor materials. The thin film transistor 800 includes a semiconductor layer 810, a gate 820, a source/drain 830 and a gate insulator 840. A passivation layer 850 may be further formed between the gate insulator 840 and the patterned planarization layer 700.

Figure 6:
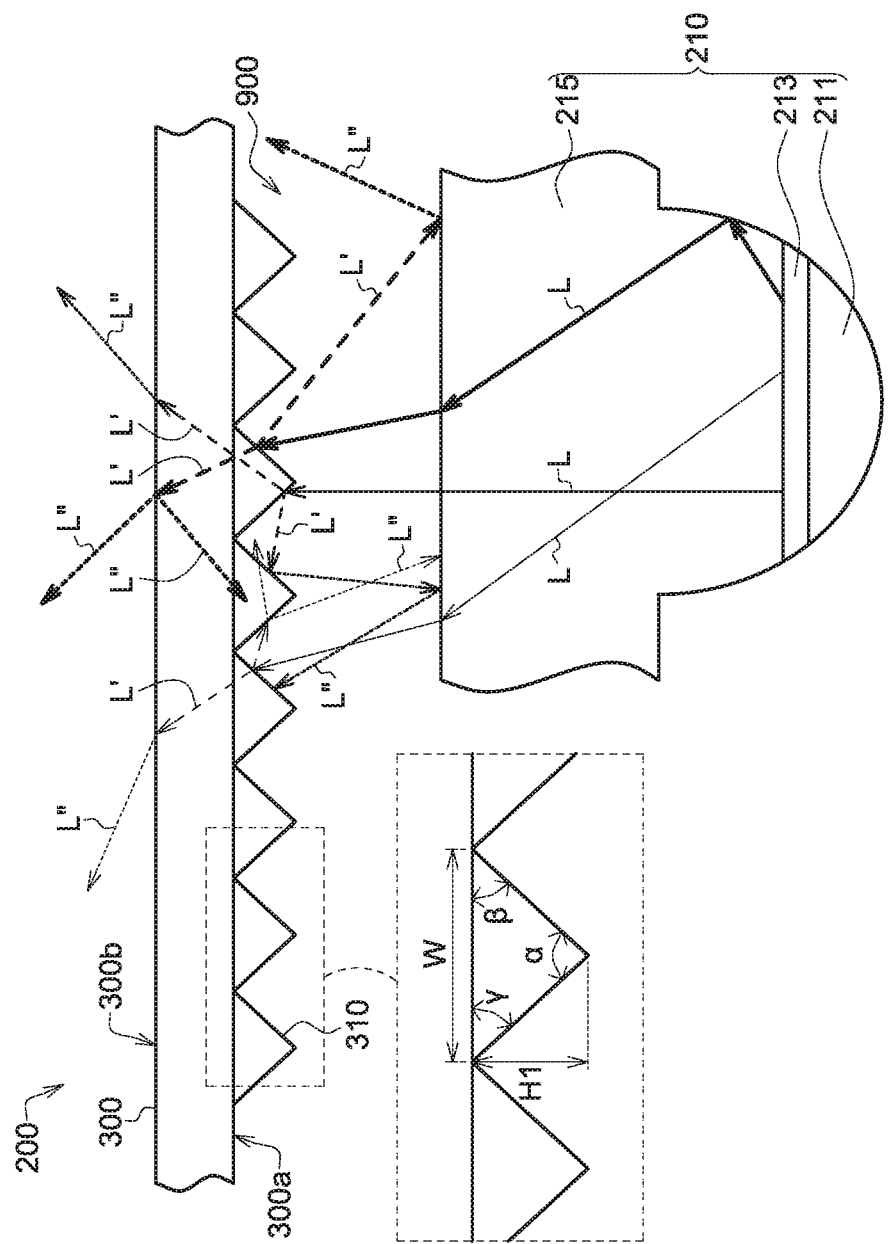
FIG. 6 shows a partial cross-sectional view of a second substrate, a gel layer, and a light emitting diode chip according to an embodiment of the present disclosure.

FIG. 6 shows a partial cross-sectional view of a second substrate, a gel layer, and a light emitting diode chip according to an embodiment of the present disclosure. The elements in the embodiment sharing similar or the same labels with those in the previous embodiment are similar or the same elements, and the description of which is omitted.

As shown in FIG. 5, a bottom surface 300a of the second substrate 300 has a microstructure 310, and the microstructure 310 faces towards the light emitting diode chip 210. In the embodiment, the microstructure 310 has a size of between sub-micro meter to micro meter.

In the embodiment, the second substrate 300 is such as a cover glass and located on the outmost side of the display device. In such case, a light emitted from the micro light emitting diode chip 210 passes through the interface (i.e. surface 300a) between the gel layer 900 and the inner side of the second substrate 300 and then enters the second substrate 300, then the light emits from the surface 300b of the second substrate 300 on the other side, generating the emitted light, which is visible to human eyes, by the micro light emitting diode chip 210. After the light is emitted from the light emitting diode chip 210, the light undergoes a series of reflections and refractions at the interface (i.e. surface 300a) at the inner side of the second substrate 300, and the microstructure 310 can change the light propagation direction of the emitted light from the light emitting diode chip 210 at the interface (i.e. surface 300a), further making the light have greater light-emitting angle on the other side of the second substrate 300. In other words, the microstructure 310 can make the light emitting diode chip 210 to have a greater light-emitting angle at the light-emitting side of the second substrate 300 than the original light-emitting angle of the light emitting diode chip 210.

Further speaking, the refractive index of the gel layer 900 is greater than or less than the refractive index of the second substrate 300, such difference in refractive indexes generates refractions and reflections of lights at the inner side interface (i.e. surface 300a) of the second substrate 300. In addition, due to that the inner side interface (i.e. surface 300a) of the second substrate 300 has the microstructure 310, continuous light reflections and light transmissions towards two sides would occur at the inner side interface (i.e. surface 300a) of the second substrate 300 as well as the interface between the light emitting diode chip 210 and the gel layer 900, thus generating waveguide phenomenon.

In the embodiment, as shown in FIG. 6, the microstructure 310 is such as a prism structure, and the microstructure 310 may include a plurality of prisms. In some embodiments, the microstructure 310 may as well include a plurality of convex lenses (e.g. hemispherical convex structures), a plurality of concave lenses (e.g. hemispherical concave structures), and/or lenticular lenses (e.g. lenticular structures).

In the embodiment, as shown in FIG. 6, the cross section of each of the prisms has an apex angle α, a first basic angle β, and a second basic angle γ, and the apex angle α is greater than the first basic angle β and the second basic angle γ. In some embodiments, α=90°. In some embodiments, each of the prisms has a bottom width W of about less than or equal to 1 μm adjacent to the second substrate 300, or each of the prisms has a height H1 of about greater than 0 μm and less than or equal to 1 μm, the height H1 being measured starting from the second substrate 300 and along the normal line. In some other embodiments, the bottom width W or the height H1 may be greater than 1 μm and less than 100 μm.

In the embodiment, as shown in FIG. 6, the first basic angle β is located more adjacent to the light emitting diode chip 210 than the second basic angle γ (the distances are compared with respect to the same reference point of the light emitting diode chip 210), and the first basic angle β is such as greater than or equal to the second basic angle γ. As shown in FIG. 6, the light L indicates the emitted light, the light L' indicates the first reflected/refracted light at the interface between the light emitting diode chip 210 and the gel layer 900, and the light L" indicates the second reflected/refracted light at the interface (i.e. surface 300a) between the inner side of the second substrate 300 and the gel layer 900. FIG. 6 clearly shows that the light-emitting angle of the light emitting diode chip 210 at the light-emitting side of the second substrate 300 is obviously larger than the original light-emitting angle of the light emitting diode chip 210.

In the embodiment, please refer to FIGS. 5-6, the light shielding structure 400 has, for example, a ring shape, and the light shielding structure 400 surrounds the light emitting diode chip 210, such that the scattered light of the light emitting diode chip 210 can be blocked by the ring-shaped light shielding structure 400 and hardly scatter towards another adjacent light emitting diode chip 210 causing human eye-visible light-mixing. In the embodiment, the microstructure 310 is not formed in the region where the ring-shaped light shielding structure 400 covers, in order to prevent the scattered light from transmitting towards an adjacent light emitting diode chip 210 through the microstructure 310 of the second substrate 300.

Figure 7:
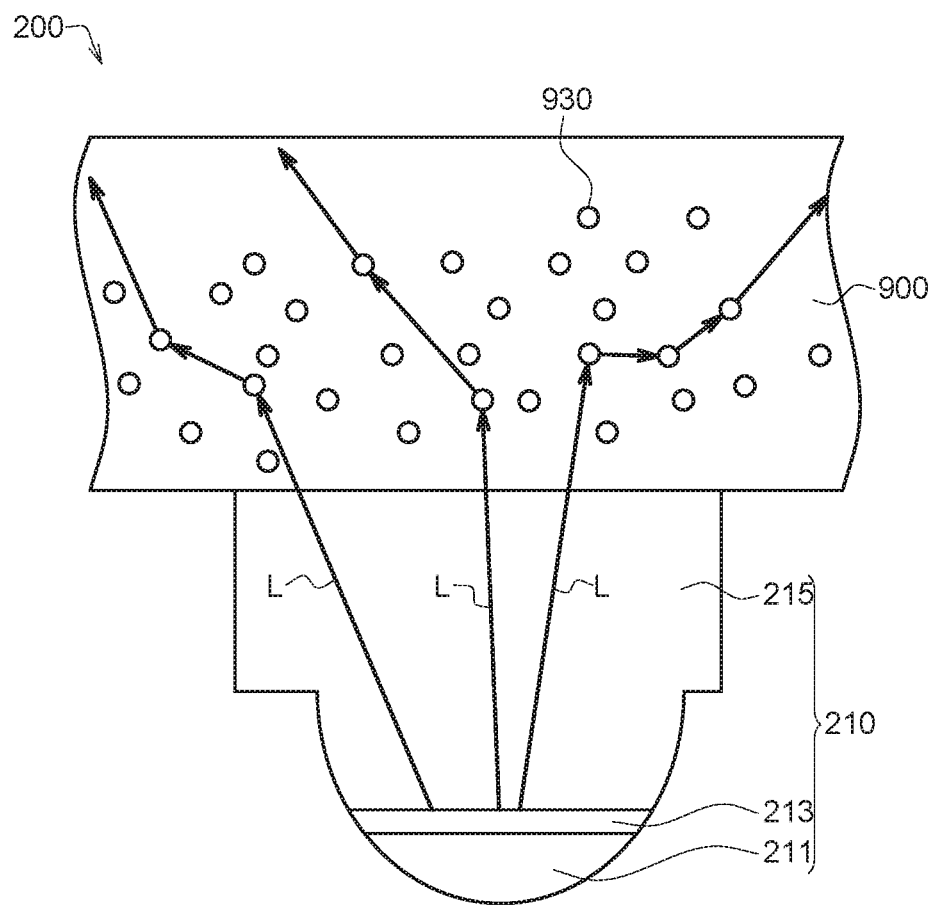
FIG. 7 shows a partial cross-sectional view of a gel layer and a light emitting diode chip according to an embodiment of the present disclosure.

FIG. 7 shows a partial cross-sectional view of a gel layer and a light emitting diode chip according to an embodiment of the disclosure. The elements in the embodiment sharing similar or the same labels with those in the previous embodiment are similar or the same elements, and the description of which is omitted.

As shown in FIG. 7, the display unit 200 may further include a plurality of micro-particles 930. The micro-particles 930 are mixed in the gel layer 900. In some embodiments, a diameter of the micro-particles 930 is ranged from 0.4 μm to 0.8 μm.

In the embodiment, the refractive index of the micro-particles 930 is different from the refractive index of the gel layer 900. In some embodiments, the shape of the micro-particles 930 may be spherical, cylinder, rhombus or triangle, and etc.; the material of the micro-particles 930 may include silicon dioxide, titanium dioxide, gold alloy, silver alloy, plastic or resin, and etc. However, the present disclosure is not limited thereto.

In the embodiment, as shown in FIG. 7, the lights L emitted from micro light emitting diode chip 210 may undergo scattering by the micro-particles 930, and the lights L are scattered towards the surroundings of the micro-particles, changing the moving direction of the lights L and preventing the lights from transmitting within a small angle range. As such, emitted lights of micro light emitting diode chip 210 can be scattered and of which the light-emitting angle can be enlarged. Furthermore, the addition of the micro-particles 930 can increase the overall haze of the gel layer 900 and prevent the environmental lights from being reflected by the metal layers underneath the gel layer 900 to influence the display effects.

Figure 8:
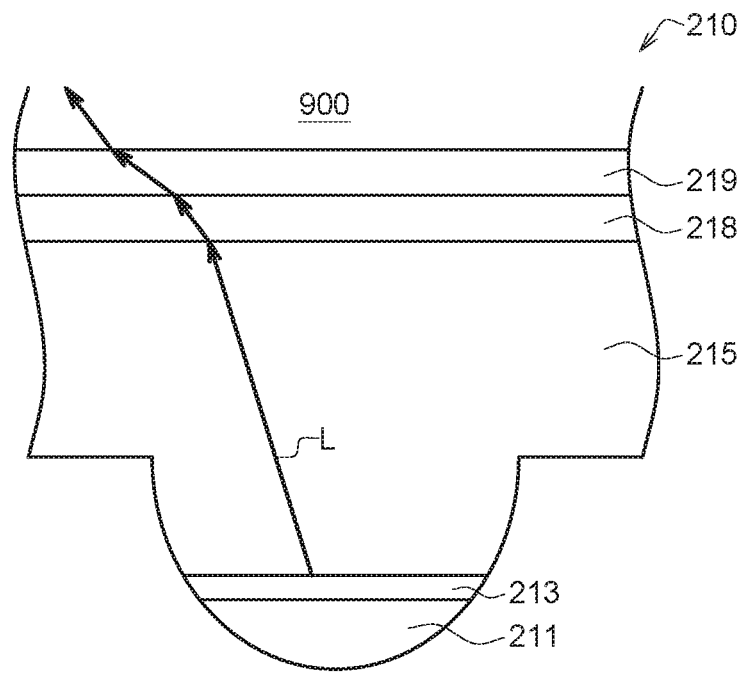
FIG. 8 shows a partial cross-sectional view of a gel layer and a light emitting diode chip according to another embodiment of the present disclosure.

FIG. 8 shows a partial cross-sectional view of a gel layer and a light emitting diode chip according to another embodiment of the disclosure. The elements in the embodiment sharing similar or the same labels with those in the previous embodiment are similar or the same elements, and the description of which is omitted.

As shown in FIG. 8, the light emitting diode chip 210 includes a P type layer 211, a light emitting layer 213 and an N type layer 215. The materials of the P type layer 211 and the N type layer 215 may be GaN. As shown in FIG. 8, in the embodiment, the light emitting diode chip 210 may further include a first material layer 218 and a second material layer 219. The first material layer 218 is disposed between the N type layer 215 and the second substrate 300, and the first material layer 218 has a first refractive index. The second material layer 219 is disposed between the first material layer 219 and the second substrate 300, and the second material layer 219 has a second refractive index. The N type layer 215 has a N type layer refractive index, the N type refractive index is greater than the first refractive index, and the first refractive index is greater than the second refractive index.

In the embodiment, the refractive index of the second material layer 219 is less than the refractive index of the first material layer 218, and the refractive index of the first material layer 218 is less than the refractive index of the N type layer 215. In other words, the N type layer 215, the first material layer 218 and the second material layer 219 have decreasing refractive indexes. Further speaking, the gel layer 900 is disposed between the second substrate 300 and the second material layer 219, the refractive index of the gel layer 900 is greater than or less than the refractive index of the second material layer 219, and the refractive index of the gel layer 900 is greater than the refractive index of the second substrate 300.

In the embodiment, the first material layer 218 is such as a ZnO layer, and the second material layer 219 is such as an ITO layer, but not limited thereto.

For example, the N type layer 215 is such as a GaN layer having a refractive index of 2.38, the first material layer 218 is such as a ZnO layer having a refractive index of 1.99, the second material layer 219 is such as an ITO layer having a refractive index of 1.7, the gel layer 900 has a refractive index ranged from 1.5 to 1.8 (not including 1.7, which is the refractive index of the second material layer 219), and the second substrate 300 is such as a glass having a refractive index of 1.5.

Generally speaking, because GaN (N type layer 215) has high refractive index, after the light L is generated from the light emitting layer 213 of the light emitting diode chip 210, the light L is transmitted to the interface of the light emitting diode chip 210 and the gel layer 900. If the refractive index of the gel layer 900 is less than that of GaN (N type layer 215), total reflection of the light L is very likely to happen at the interface, making the light L less easier to emit from the light emitting diode chip 210 out of the interface and thus making the micro light emitting diode chip have smaller light-emitting angle. That is, the larger the refractive index difference between the materials located on two sides of the interface is, the smaller the light-emitting angle of the light emitting diode chip 210 would be. According to the embodiments of the disclosure, the first material layer 218 and the second material layer 219 form multiple interfaces, and the refractive indexes of the multiple layers decrease layer-by-layer from inner side towards outer side, such that the refractive index differences between two sides of these interfaces are smaller, total reflections are reduced, light-emitting angle of the light emitting diode chip 210 is increased, and the light extraction efficiency of the light emitting diode chip 210 can be further increased.

According to some other embodiments, the light emitting diode chip 210 may further include a plurality of material layers located on the N type layer 215, and the refractive indexes of these material layers gradually decrease from the N type layer 215 towards the gel layer 900 direction and yet greater than or less than the refractive index of the gel layer 900. As such, the light-emitting angle of the light emitting diode chip 210 can be as well increased, and the light extraction efficiency of the light emitting diode chip 210 can be further increased.

Figure 9:
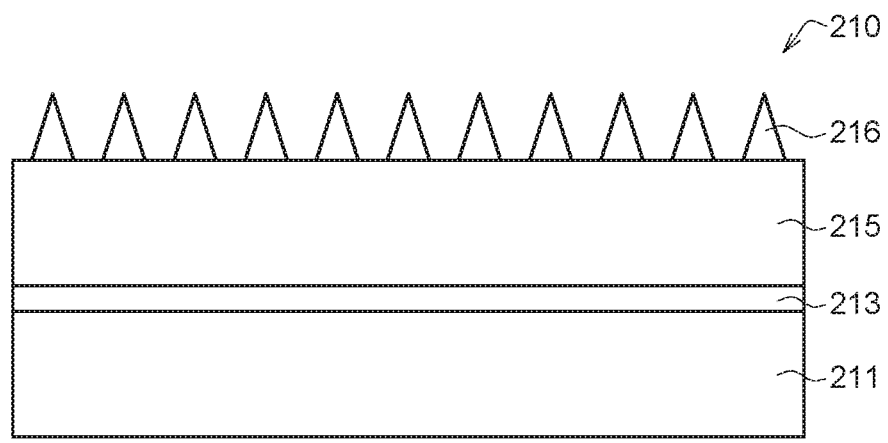
FIG. 9 shows a partial cross-sectional view of a light emitting diode chip according to an embodiment of the present disclosure.

FIG. 9 shows a partial cross-sectional view of a light emitting diode chip according to an embodiment of the disclosure. The elements in the embodiment sharing similar or the same labels with those in the previous embodiment are similar or the same elements, and the description of which is omitted.

As shown in FIG. 9, a top surface 210a of the light emitting diode chip 210 has a light scattering structure 216. For example, the light scattering structure 216 may include a plurality of nano-protrusions, such as a plurality of prisms (as shown in FIG. 9) or a plurality of lenticular protrusions (not shown in drawings). The scattering structure 216 can increase the light-emitting angle of the light emitting diode chip 210 and further increase the light extraction efficiency of the light emitting diode chip 210.

FIGS. 10A-10B, FIGS. 11A-11B, FIGS. 12A-12B, FIGS. 13A-13B, FIGS. 14A-14B and FIGS. 15A-15B show schematic drawings of display devices and the assemblies thereof according to some embodiments of the present disclosure. The elements in the embodiment sharing similar or the same labels with those in the previous embodiment are similar or the same elements, and the description of which is omitted.

In the following embodiments, the first substrate 100 is such as a thin film transistor substrate, and the second substrate 300 is such as a cover glass, but the present disclosure is not limited thereto.

In an embodiment, as shown in FIG. 10A, the microstructure 310 is manufactured on the second substrate 300, the light emitting diode chips 210 having different light colors (e.g. red light emitting diode chip 210R, green light emitting diode chip 210G and blue light emitting diode chip 210B), the contact pads 217, the light shielding structure 400 and the gel layer 900 mixed with micro-particles 930 are manufactured on the first substrate 100, and then the first substrate 100 is assembled to the second substrate 300. As such, not only the coating of the gel layer 900 is easier, but the assembling is also easier. Next, as shown in FIG. 10B, the manufacture of the display device 50A is completed.

In an embodiment, as shown in FIG. 11A, the microstructure 310, a portion of the gel layer 900 mixed with micro-particles 930, and a portion of the light shielding structure 400 are manufactured on the second substrate 300, the light emitting diode chips 210 having different light colors (e.g. red light emitting diode chip 210R, green light emitting diode chip 210G and blue light emitting diode chip 210B), the contact pads 217, another portion of the light shielding structure 400 and another portion of the gel layer 900 mixed with micro-particles 930 are manufactured on the first substrate 100, and then the first substrate 100 is assembled to the second substrate 300. As such, the layout space can be enlarged. Next, as shown in FIG. 11B, the manufacture of the display device 50B is completed.

In an embodiment, as shown in FIG. 12A, the microstructure 310, a portion of the gel layer 900 mixed with micro-particles 930 and phosphor particles 940, a portion of the light shielding structure 400, and the color regions 500R, 500G and 500B of the color filter layer 500 are manufactured on the second substrate 300, the light emitting diode chips 210, the contact pads 217, another portion of the light shielding structure 400 and another portion of the gel layer 900 mixed with micro-particles 930 and phosphor particles 940 are manufactured on the first substrate 100, and then the first substrate 100 is assembled to the second substrate 300. As such, the layout space can be enlarged. Next, as shown in FIG. 12B, the manufacture of the display device 50C is completed.

In the display device 50C as shown in FIG. 12B, the display unit 200 may further include a plurality of phosphor particles 940, and the phosphor particles 940 are mixed in the gel layer 900. The lights emitted from the light emitting diode chip 210 pass through the gel layer 900 mixed with the phosphor particles 940 and are converted into white lights. The white lights are then passing through the different color regions of the color filter layer 500 to emit lights with different colors.

In the embodiment as shown in FIG. 12B, the phosphor particles 940 may be replaced by quantum dots (QD). The ultraviolet light emitted from the light emitting diode chip 210 passes through the gel layer 900 mixed with quantum dots and is converted into a visible light or an infrared light.

In an embodiment, as shown in FIG. 13A, the microstructure 310, the gel layer 900 mixed with micro-particles 930 and phosphor particles 940, the light shielding structure 400, and the color regions 500R, 500G and 500B of the color filter layer 500 are manufactured on the second substrate 300, the light emitting diode chips 210 and the contact pads 217 are manufactured on the first substrate 100, and then the first substrate 100 is assembled to the second substrate 300. Next, as shown in FIG. 13B, the manufacture of the display device 50D is completed.

In the embodiment as shown in FIG. 13B, the phosphor particles 940 may be replaced by quantum dots. The ultraviolet light emitted from the light emitting diode chip 210 passes through the gel layer 900 mixed with quantum dots and is converted into a visible light or an infrared light.

In an embodiment, as shown in FIG. 14A, the microstructure 310, the gel layer 900 mixed with micro-particles 930 and the light shielding structure 400 are manufactured on the second substrate 300, the light emitting diode chips 210 having different light colors (e.g. red light emitting diode chip 210R, green light emitting diode chip 210G and blue light emitting diode chip 210B) and the contact pads 217 are manufactured on the first substrate 100, and then the first substrate 100 is assembled to the second substrate 300. Next, as shown in FIG. 14B, the manufacture of the display device 50E is completed.

In an embodiment, as shown in FIG. 15A, the microstructure 310, a portion of the gel layer 900 mixed with micro-particles 930 and quantum dots 950, and a portion of the light shielding structure 400 are manufactured on the second substrate 300, the light emitting diode chips 210, the contact pads 217, another portion of the light shielding structure 400 and another portion of the gel layer 900 mixed with micro-particles 930 and quantum dots 950 are manufactured on the first substrate 100, and then the first substrate 100 is assembled to the second substrate 300. As such, not only the coating of the gel layer 900 is easier, but the bonding of the light emitting diode chips 210 and the assembling are also easier. Next, as shown in FIG. 15B, the manufacture of the display device 50F is completed.

In the display device 50F as shown in FIG. 15B, the display unit 200 further include a plurality of quantum dots 950, and the quantum dots 950 are mixed in the gel layer 900. The ultraviolet light emitted from the light emitting diode chip 210 passes through the gel layer 900 mixed with quantum dots 950 and is converted into a visible light with a predetermined wavelength or an infrared light.

For example, when the quantum dots 950 mixed in the gel layer 900 have a size of 2-3 nm, the ultraviolet light passed though the gel layer 900 can be converted into a blue light; when the quantum dots 950 mixed in the gel layer 900 have a size of 3-4 nm, the ultraviolet light passed though the gel layer 900 can be converted into a green light; when the quantum dots 950 mixed in the gel layer 900 have a size of 4-5 nm, the ultraviolet light passed though the gel layer 900 can be converted into a red light; when the quantum dots 950 mixed in the gel layer 900 have a size of 6-8 nm, the ultraviolet light passed though the gel layer 900 can be converted into an infrared light. However, the sizes and the materials of the quantum dots of the disclosure are not limited to the above embodiments.

In the embodiment as shown in FIG. 15B, when the emitted light is a visible light such as a red light, a green light or a blue light, each of the display unit 200 can be used as a sub-pixel; when the emitted light is in infrared light, each of the display unit 200 can be used as an IR sensor.

In the embodiments as shown in FIGS. 10A-10B, FIGS. 11A-11B, FIGS. 12A-12B, FIGS. 13A-13B, FIGS. 14A-14B and FIGS. 15A-15B, the types and arrangements of the light emitting diode chips 210 can be replaced and combined generating new embodiments of the disclosure. For example, a light emitting diode chip of one embodiment can be replaced by an infrared light emitting diode chip, and phosphor particles 940 and quantum dots 950 together with different types of light emitting diode chips 210 can be arranged in different display units 200 of one display device.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
a first substrate;
a second substrate disposed opposite to the first substrate;
a display unit disposed on the first substrate, wherein the display unit comprises at least one light emitting diode chip;
a light shielding structure disposed between the first substrate and the second substrate, wherein the light shielding structure surrounds the at least one light emitting diode chip of the display unit; and
a patterned planarization layer disposed between the first substrate and the light shielding structure, wherein the patterned planarization layer has a recess, and at least a portion of the at least one light emitting diode chip of the display unit is located in the recess.

2. The display device according to claim 1, wherein the light shielding structure has a first height, and the first height is ranged from 3□ m to 30□ m.

3. The display device according to claim 1, wherein the display unit further comprises a first contact pad and a second contact pad, and the first substrate further comprises a thin film transistor and a signal electrode, wherein the at least one light emitting diode chip is electrically connected to the thin film transistor via the first contact pad, and the at least one light emitting diode chip is electrically connected to the signal electrode via the second contact pad.

4. The display device according to claim 3, wherein the display unit further comprises a third contact pad, and the at least one light emitting diode chip is electrically connected to the thin film transistor or the signal electrode via the third contact pad.

5. The display device according to claim 1, wherein a top portion of the at least one light emitting diode chip and the second substrate are separated by a first gap.

6. The display device according to claim 3, wherein the at least one light emitting diode chip comprises:
- a P type layer disposed adjacent to the first substrate, the P type layer being electrically connected to the first contact pad;
- a N type layer disposed adjacent to the second substrate, the N type layer being electrically connected to the second contact pad; and
- a light emitting layer disposed between the P type layer and the N type layer.

7. The display device according to claim 6, wherein the at least one light emitting diode chip further comprises:
- a first material layer disposed between the N type layer and the second substrate, the first material layer having a first refractive index; and
- a second material layer disposed between the first material layer and the second substrate, the second material layer having a second refractive index;
- wherein the N type layer has a N type layer refractive index, the N type layer refractive index is greater than the first refractive index, and the first refractive index is greater than the second refractive index.

8. The display device according to claim 1, wherein a top surface of the at least one light emitting diode chip has a light scattering structure.

9. The display device according to claim 1, wherein the display unit further comprises:
- a plurality of the light emitting diodes;
- a color filter layer disposed on the second substrate, wherein the color filter layer has a plurality of color regions, and the color regions are respectively disposed on the corresponding light emitting diode chips; and
- a plurality of phosphor layers separated from each other, the phosphor layers respectively disposed between the corresponding light emitting diode chips and the color regions.

10. The display device according to claim 1, wherein the patterned planarization layer is connected to the light shielding structure.

11. The display device according to claim 1, wherein the display unit further comprises:
- a gel layer disposed between the second substrate and the at least one light emitting diode chip, wherein a third refractive index of the gel layer is greater than a second substrate refractive index of the second substrate.

12. The display device according to claim 11, wherein the display unit further comprises:
- a plurality of micro-particles mixed in the gel layer, wherein a diameter of the micro-particles is ranged from 0.4☐ m to 0.8☐ m.

13. The display device according to claim 11, wherein the display unit further comprises:
- a plurality of phosphor particles mixed in the gel layer, wherein a first color light emitted from the at least one light emitting diode chip passes through the gel layer and is converted into a second color light.

14. The display device according to claim 11, wherein the display unit further comprises:
- a plurality of quantum dots mixed in the gel layer, wherein an ultraviolet light emitted from the at least one light emitting diode chip passes through the gel layer and is converted into a visible light or an infrared light.

15. The display device according to claim 1, wherein a bottom surface of the second substrate has a microstructure, and the microstructure faces towards the at least one light emitting diode chip.

16. The display device according to claim 15, wherein the microstructure comprises a plurality of prisms, a cross section of each of the prisms has an apex angle, a first basic angle, and a second basic angle, and the apex angle is greater than the first basic angle and the second basic angle.

17. The display device according to claim 16, wherein the first basic angle is disposed adjacent to the at least one light emitting diode chip than the second basic angle, and the first basic angle is greater than or equal to the second basic angle.

* * * * *